(12) United States Patent
Ban et al.

(10) Patent No.: US 6,221,771 B1
(45) Date of Patent: Apr. 24, 2001

(54) METHOD OF FORMING TUNGSTEN SILICIDE FILM, METHOD OF FABRICATING SEMICONDUCTOR DEVICES AND SEMICONDUCTOR MANUFACTURED THEREBY

(75) Inventors: Cozy Ban; Akinobu Teramoto, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/111,880

(22) Filed: Jul. 8, 1998

(30) Foreign Application Priority Data

Jan. 14, 1998 (JP) .................................. 10-005520

(51) Int. Cl.$^7$ .................................................. H01L 21/44
(52) U.S. Cl. ......................... 438/683; 438/592; 438/680
(58) Field of Search .................... 438/592, 680, 438/683

(56) References Cited

U.S. PATENT DOCUMENTS

| 5,231,056 | 7/1993 | Sandhu ............................ 437/200 |
| 5,500,249 | 3/1996 | Telford et al. ..................... 427/255 |
| 5,817,576 | * 12/1999 | Tseng et al. ........................ 438/680 |
| 5,997,950 | * 12/1999 | Telford et al. ................ 427/255.392 |

FOREIGN PATENT DOCUMENTS

| 195 21 389 A1 | 6/1996 | (DE) . |
| 0 704 551 A1 | 4/1996 | (EP) . |
| 0 746 027 A2 | 12/1996 | (EP) . |
| 0 772 231 A2 | 5/1997 | (EP) . |
| 0 785 574 A2 | 7/1997 | (EP) . |
| 1-312853 | 12/1989 | (JP) . |
| 2-237025 | 9/1990 | (JP) . |
| 6-163426 | 6/1994 | (JP) . |
| 7-078991 | 3/1995 | (JP) . |
| 8-191070 | 7/1996 | (JP) . |

OTHER PUBLICATIONS

Patent Abstracts of Japan –E–839 Nov. 2, 1989 vol. 13/No. 483.

* cited by examiner

*Primary Examiner*—David Nelms
*Assistant Examiner*—Quoc Hoang
(74) *Attorney, Agent, or Firm*—McDermott, Will & Emery (57) ABSTRACT

A silicon wafer is disposed in an inert gas atmosphere, and the temperature thereof is raised, and dichlorosilane is introduced to cause a surface reaction of the silicon wafer to occur, and then dichlorosilane to which $WF_6$ is added is introduced so as to deposit tungsten silicide thinly on the above-mentioned silicon wafer. Next, the $WF_6$ is stopped and the dichlorosilane is introduced, and after that, dichlorosilane to which $WF_6$ is added is introduced so as to deposit the tungsten silicide, thus forming a tungsten silicide film.

20 Claims, 8 Drawing Sheets

FIG. 1

1. ○ RAISING TEMPERATURE
   (570°C, 0.75 TORR)
   ↓
2. ○ DCS PROCESSING 1
   (570°C, 1.5 TORR, DCS:390 SCCM)
   ↓
3. ○ DCS/WF6 INTRODUCTION-DEPOSITION 1
   (570°C, 1.5 TORR, DCS:390SCCM, WF6:1SCCM)
   ↓
4. ○ DCS PROCESSING 2
   (570°C, 0.75 TORR, DCS:130 SCCM)
   ↓
5. ○ DCS/WF6 INTRODUCTION-DEPOSITION 2
   (570°C, 0.75 TORR, DCS:130SCCM, WF6:4.5SCCM)
   ↓
6. ○ DCS PROCESSING 3
   (570°C, 0.75 TORR, DCS:325 SCCM)
   ↓
7. ○ PURGE
   (570°C, 0.75 TORR)

- 31 ~ O  DHF  (0.05%HF, 30 SECONDS, 300 RPM)
- 32 ~ O  WATER CLEANING  (15 SECONDS, 300 RPM)
- 33 ~ O  SHAKE-OFF DRYING  (15 SECONDS, 3000 RPM)
- 1 ~ O  RAISING TEMPERATURE  (570°C)
- 2 ~ O  DCS PROCESSING 1  (570°C)
- 3 ~ O  DCS/WF6 INTRODUCTION-DEPOSITION 1  (570°C)
- 4 ~ O  DCS PROCESSING 2  (570°C)
- 5 ~ O  DCS/WF6 INTRODUCTION-DEPOSITION 2  (570°C)
- 6 ~ O  DCS PROCESSING 3  (570°C)
- 7 ~ O  PURGE  (570°C)

FIG. 4

- 41 ~ O  DHF  (0.05% HF, 30 SECONDS, 300 RPM)
- 42 ~ O  NO WATER CLEANING
- 43 ~ O  SHAKE-OFF DRYING  (15 SECONDS, 3000 RPM)
- 1 ~ O  RAISING TEMPERATURE  (570°C)
- 2 ~ O  DCS PROCESSING 1  (570°C)
- 3 ~ O  DCS/WF6 INTRODUCTION-DEPOSITION 1  (570°C)
- 4 ~ O  DCS PROCESSING 2  (570°C)
- 5 ~ O  DCS/WF6 INTRODUCTION-DEPOSITION 2  (570°C)
- 6 ~ O  DCS PROCESSING 3  (570°C)
- 7 ~ O  PURGE  (570°C)

- 61 — INTRODUCTION OF WAFER TO CHAMBER
- 62 — INTRODUCTION TO LOWER PART CHAMBER
- 63 — SETTING WAFER FIXING STAND
- 64 — DHF PROCESSING (30°C, 3 MINUTES)
- 1 — RAISING TEMPERATURE (570°C)
- 2 — DCS PROCESSING 1 (570°C)
- 3 — DCS/WF6 INTRODUCTION-DEPOSITION 1 (570°C)
- 4 — DCS PROCESSING 2 (570°C)
- 5 — DCS/WF6 INTRODUCTION-DEPOSITION 2 (570°C)
- 6 — DCS PROCESSING 3 (570°C)
- 7 — PURGE (570°C)

FIG. 7

- 71 — INTRODUCTION OF WAFER TO CHAMBER
- 72 — AHF GAS PROCESSING (30°C, 3 MINUTES)
- 1 — RAISING TEMPERATURE (570°C)
- 2 — DCS PROCESSING 1 (570°C)
- 3 — DCS/WF6 INTRODUCTION-DEPOSITION 1 (570°C)
- 4 — DCS PROCESSING 2 (570°C)
- 5 — DCS/WF6 INTRODUCTION-DEPOSITION 2 (570°C)
- 6 — DCS PROCESSING 3 (570°C)
- 7 — PURGE (570°C)

FIG. 8

81~ ○ RAISING TEMPERATURE (40°C)
↓
82~ ○ ALCOHOL IONIZATION HF PROCESSING (40°C, 3 MINUTES)
↓
2~ ○ DCS PROCESSING 1 (570°C)
↓
3~ ○ DCS/WF6 INTRODUCTION-DEPOSITION 1 (570°C)
↓
4~ ○ DCS PROCESSING 2 (570°C)
↓
5~ ○ DCS/WF6 INTRODUCTION-DEPOSITION 2 (570°C)
↓
6~ ○ DCS PROCESSING 3 (570°C)
↓
7~ ○ PURGE (570°C)

FIG. 9

91~ ○ RAISING TEMPERATURE (120°C)
↓
92~ ○ HF GAS PROCESSING (120°C, 1 MINUTES)
↓
2~ ○ DCS PROCESSING 1 (570°C)
↓
3~ ○ DCS/WF6 INTRODUCTION-DEPOSITION 1 (570°C)
↓
4~ ○ DCS PROCESSING 2 (570°C)
↓
5~ ○ DCS/WF6 INTRODUCTION-DEPOSITION 2 (570°C)
↓
6~ ○ DCS PROCESSING 3 (570°C)
↓
7~ ○ PURGE (570°C)

FIG. 10

101~ ○ RAISING TEMPERATURE  (830°C)
     ↓
102~ ○ H2 PROCESSING  (830°C, 1 MINUTES)
     ↓
  2~ ○ DCS PROCESSING 1  (570°C)
     ↓
  3~ ○ DCS/WF6 INTRODUCTION-DEPOSITION 1  (570°C)
     ↓
  4~ ○ DCS PROCESSING 2  (570°C)
     ↓
  5~ ○ DCS/WF6 INTRODUCTION-DEPOSITION 2  (570°C)
     ↓
  6~ ○ DCS PROCESSING 3  (570°C)
     ↓
  7~ ○ PURGE  (570°C)

FIG. 11

111~ ○ H2O2/HF SOLUTION PROCESSING  ( H2O2:30%, HF:0.005%, 3 MINUTES)
     ↓
  1~ ○ RAISING TEMPERATURE  (570°C)
     ↓
  2~ ○ DCS PROCESSING 1  (570°C)
     ↓
  3~ ○ DCS/WF6 INTRODUCTION-DEPOSITION 1  (570°C)
     ↓
  4~ ○ DCS PROCESSING 2  (570°C)
     ↓
  5~ ○ DCS/WF6 INTRODUCTION-DEPOSITION 2  (570°C)
     ↓
  6~ ○ DCS PROCESSING 3  (570°C)
     ↓
  7~ ○ PURGE  (570°C)

FIG. 12

- 121~ ○ H2O2/HF SOLUTION PROCESSING (H2O2:3%, HF:0.1%, 3 MINUTES)
- 1~ ○ RAISING TEMPERATURE (570°C)
- 2~ ○ DCS PROCESSING 1 (570°C)
- 3~ ○ DCS/WF6 INTRODUCTION-DEPOSITION 1 (570°C)
- 4~ ○ DCS PROCESSING 2 (570°C)
- 5~ ○ DCS/WF6 INTRODUCTION-DEPOSITION 2 (570°C)
- 6~ ○ DCS PROCESSING 3 (570°C)
- 7~ ○ PURGE (570°C)

FIG. 13

- 131~ ○ H2O2/SOLUTION PROCESSING (H2O2:30%, 3 MINUTES)
- 1~ ○ RAISING TEMPERATURE (570°C)
- 2~ ○ DCS PROCESSING 1 (570°C)
- 3~ ○ DCS/WF6 INTRODUCTION-DEPOSITION 1 (570°C)
- 4~ ○ DCS PROCESSING 2 (570°C)
- 5~ ○ DCS/WF6 INTRODUCTION-DEPOSITION 2 (570°C)
- 6~ ○ DCS PROCESSING 3 (570°C)
- 7~ ○ PURGE (570°C)

FIG. 14

141~ ○  RAISING TEMPERATURE   (400°C)
     ↓
142~ ○  OZONE/HF GAS PROCESSING   (400°C)
     ↓
  2~ ○  DCS PROCESSING 1   (570°C)
     ↓
  3~ ○  DCS/WF6 INTRODUCTION-DEPOSITION 1   (570°C)
     ↓
  4~ ○  DCS PROCESSING 2   (570°C)
     ↓
  5~ ○  DCS/WF6 INTRODUCTION-DEPOSITION 2   (570°C)
     ↓
  6~ ○  DCS PROCESSING 3   (570°C)
     ↓
  7~ ○  PURGE   (570°C)

FIG. 15

151~ ○  RAISING TEMPERATURE   (450°C)
     ↓
152~ ○  OZONE PROCESSING   (450°C)
     ↓
  2~ ○  DCS PROCESSING 1   (570°C)
     ↓
  3~ ○  DCS/WF6 INTRODUCTION-DEPOSITION 1   (570°C)
     ↓
  4~ ○  DCS PROCESSING 2   (570°C)
     ↓
  5~ ○  DCS/WF6 INTRODUCTION-DEPOSITION 2   (570°C)
     ↓
  6~ ○  DCS PROCESSING 3   (570°C)
     ↓
  7~ ○  PURGE   (570°C)

METHOD OF FORMING TUNGSTEN SILICIDE FILM, METHOD OF FABRICATING SEMICONDUCTOR DEVICES AND SEMICONDUCTOR MANUFACTURED THEREBY

BACKGROUND OF THE INVENTION

1. Field of the Invention

The present invention relates to a forming method of forming tungsten silicide ($WSi_x$) on polysilicon or single crystal silicon in manufacturing a semiconductor device, and to a semiconductor manufacturing method and a semiconductor device to which this method is applied.

2. Background Art

It has become usual that, in a semiconductor device, a tungsten silicide ($WSi_x$) film is formed on a polysilicon or single crystal silicon included in a silicon wafer. The tungsten silicide ($WSi_x$) has a possibility of exhibiting a low electrical resistance. On the other hand, the film forming process of the tungsten silicide is very much influenced by a surface condition of a polysilicon or a silicon. This tends to cause a process failure such as peeling of a silicide film, so that stable depositing of a silicide film having superior characteristics is difficult. This is a problem in the application to the mass production. Hereinafter, in the present invention, a technical term of the silicon wafer is used to mean either a polysilicon or a single crystal silicon.

SUMMARY OF THE INVENTION

The present invention has been made in order to solve the above-mentioned problems, and the object thereof is to stably obtain a tungsten silicide film of superior performances.

According to one aspect of the present invention, a method of forming a tungsten silicide film comprises the following processes in the following order. First, a temperature raising process of disposing a silicon wafer in an inert gas atmosphere and raising the temperature thereof. Next, a first dichlorosilane (DCS) treatment process of introducing DCS so as to generate a surface reaction of the silicon wafer. Next, a first deposition process of introducing $WF_6$ in addition to the DCS so as to generate a surface reaction of the silicon wafer. Then, a second DCS treatment process of shutting off the $WF_6$ and introducing the DCS. Finally, a second deposition process of introducing $WF_6$ in addition to the DCS so as to deposit tungsten silicide.

In the method of forming a tungsten silicide film, a surface of the silicon wafer is preferably reduced through the temperature raising process and the first DCS treatment process.

In the method of forming a tungsten silicide film, the first DCS treatment process and the first deposition process are performed preferably at an atmospheric pressure which is 1.5 to 3.0 times as high as an atmospheric pressure in the temperature raising process, the second DCS treatment process, and the second deposition process.

In the method of forming a tungsten silicide film, a mixture ratio between the $WF_6$ and the DCS in the first deposition process is preferably in a range of 1:300 to 1:500, and a mixture ratio between the $WF_6$ and the DCS in the second deposition process is preferably in a range of 1:30 to 1:50.

In the method of forming a tungsten silicide film, an introduced quantity of the DCS in the second DCS treatment process is set preferably to be substantially equal to that in the second deposition process.

In the method of forming a tungsten silicide film, a flow quantity ratio of the DCS between the first deposition process and the second deposition process is preferably set to be in a range of 1:1 to 5:1.

In the method of forming a tungsten silicide film, preceding the first DCS treatment process, preferably performed is a surface treatment process of processing the surface of the silicon wafer into a surface state in which the DCS decomposes easily.

In the method of forming a tungsten silicide film, the surface state has preferably termination of Si with fluorine (F).

In the method of forming a tungsten silicide film, the surface treatment process comprises preferably a process of processing the surface of the silicon wafer with dilute hydrofluoride solution (DHF) the concentration of which is not less than 0.05%, and a process of drying the surface of the silicon wafer with F constituent left thereon.

In the method of forming a tungsten silicide film, the surface treatment process preferably comprises a process of processing the surface of the silicon wafer using any of gas phase HF, $NF_3$ or $ClF_3$.

In the method of forming a tungsten silicide film, instead of the temperature raising process, preferably performed is a treatment process of processing the silicon wafer using $H_2$ gas in a range of 300° C. to 850° C.

In the method of forming a tungsten silicide film, instead of the temperature raising process and the first DCS treatment process, preferably performed is a treatment process of processing the silicon wafer using $H_2$ gas in a range of 300° C. to 850° C.

In the method of forming a tungsten silicide film, preceding to the temperature raising process, preferably performed is a treatment process of processing the silicon wafer with either a processing solution of hydrogen peroxide the concentration of which is in a range of 0.1 to 35%, a processing solution in which solved is $O_3$ the concentration of which is in a range of 0.5 to 30 ppm, or a processing solution in which hydrogen peroxide and ozone are solved.

In the method of forming a tungsten silicide film, any of the processing solutions preferably contain HF the concentration of which is in a range of 0.001 to 0.5%.

In the method of forming a tungsten silicide film, instead of the temperature raising process, preferably performed is a treatment process of processing the silicon wafer using either $O_2$ gas, $O_3$ gas, or $H_2O$ vapor.

In the method of forming a tungsten silicide film, instead of the temperature raising process or the first DCS treatment process, preferably performed is a treatment process of processing the silicon wafer using either $O_2$ gas, $O_3$ gas, or $H_2O$ vapor.

In the method of forming a tungsten silicide film, preferably a tungsten-high constituting layer is deposited on an interface with the silicon wafer, and a tungsten-low constituting layer is deposited on the tungsten-high constituting layer.

In the method of forming a tungsten silicide film, the ratio in number between tungsten atoms and silicon atoms in the tungsten silicide film is preferably 2.4 or less in the tungsten-high constituting layer, and is preferably 2.5 or more in the tungsten-low constituting layer.

According to another aspect of the present invention, a method of fabricating a semiconductor device comprises a process in which the tungsten silicide film is formed through a forming process as defined above.

According to another aspect of the present invention, a semiconductor device comprises the tungsten silicide film formed through a forming process as defined above.

Other and further objects, features and advantages of the invention will appear more fully from the following description.

BEST MODE OF CARRYING OUT THE INVENTION

Referring to the drawings, the description will be given below with reference to some embodiments of the present invention. Additionally, in the drawings, the same reference numeral designates the same or equivalent processing step.

First Embodiment

Figure 1:
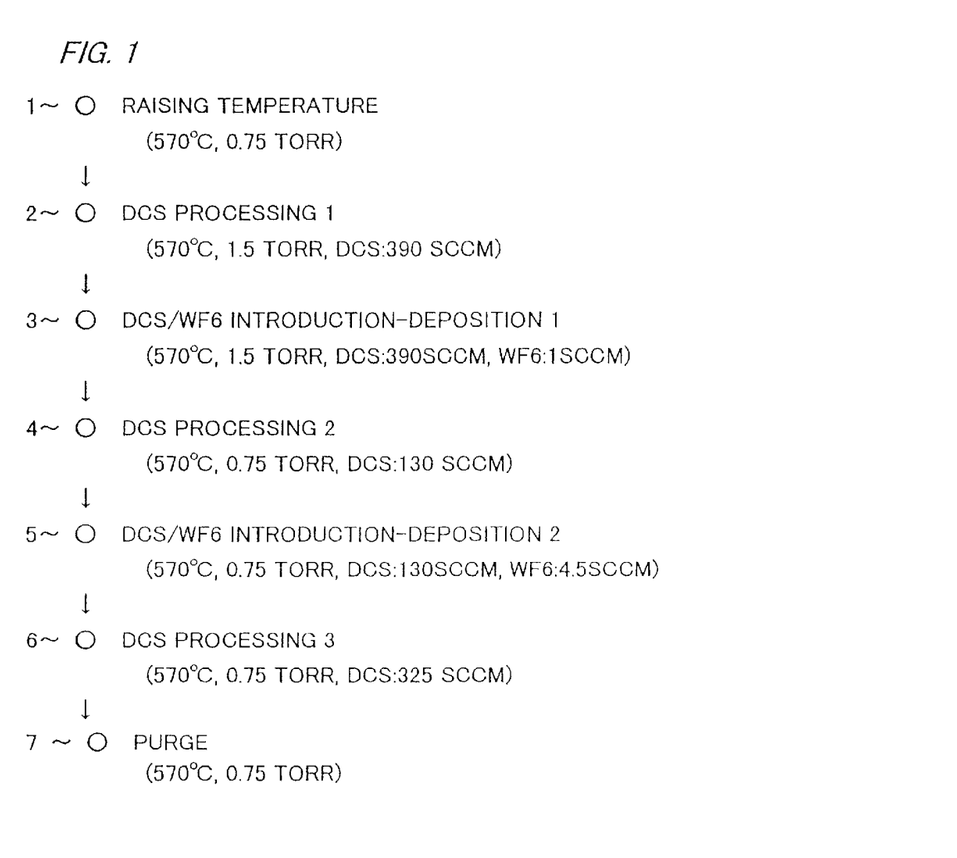
FIG. 1 is a process flow chart for describing a method of forming a tungsten silicide film according to a first embodiment of the present invention.

FIG. 1 is a process flow chart for describing a method of forming a tungsten silicide film according to a first embodiment of the present invention.

The first embodiment regulates the kind of gases and their flow quantity used in a process of depositing the tungsten silicide ($WSi_x$) film on polysilicon or silicon single crystal.

Referring to the drawings, a process of forming a tungsten silicide film will be described.

First, a silicon wafer is introduced into a processing chamber (not illustrated). The silicon wafer is maintained at not less than 550° C. in an argon (Ar) atmosphere of a pressure below 133Pa (1 Torr). (a processing step 1 in FIG. 1, a temperature raising processing step).

Then, dichlorosilane (DCS: $SiH_2Cl_2$) (hereinafter, referred to as DCS appropriately) is introduced so as to make the pressure equal 199.5±66.5Pa (1.5±0.5 Torr), thus a conditioning of a surface of the Si wafer is performed. (a processing step 2 in FIG. 1, i.e. a first DCS processing step, hereinafter referred to as DCS processing 1).

In this process, the flow quantity is secured to be greater than or equal to 300 sccm, although the flow quantity may depends on a volume of the processing chamber. The temperature raising process and the DCS processing 1 bring about a reduction effect of the Si wafer surface.

Next, with the DCS flow quantity maintained and with the pressure left unchanged, tungsten hexafluoride ($WF_6$) is mixed by about not more than one-three hundredth of the DCS flow quantity (a processing step 3 in FIG. 1 which is a first deposition processing step, hereinafter, referred to as $DCS/WF_6$ introduction-deposition 1).

Following this step, the DCS flow quantity is decreased to an order of 100 sccm, about one third of the flow quantity in the preceding step, and at the same time the mixing of the $WF_6$ is stopped. At this time, the pressure is decreased to not more than 1 torr (a processing step 4 in FIG. 1 which is a second DCS processing step, hereinafter, referred to as DCS processing 2). The processing steps after this are performed with this low pressure maintained.

Immediately after the second DCS processing step in which only the DCS is introduced, while keeping the introduction of the DCS, an introduction of the $WF_6$ is started again. In this second introduction of the $WF_6$, it is desirable to ensure the flow quantity three times greater than or equal to the flow quantity at the first introduction (a processing step 5 in FIG. 1 which is a second deposition processing step, hereinafter, referred to as $DCS/WF_6$ introduction-deposition 2). In this processing step, the tungsten silicide ($WSi_x$) can substantially be deposited chemically (CVD: Chemical Vapor Deposition).

Following this major deposition processing step, the mixing of the $WF_6$ is stopped, and while increasing the DCS flow quantity up to 2.5 times as much as the flow quantity at the processing step 5, a processing of the surface after the deposition is performed (a processing step 6 in FIG. 1 which is a third DCS processing step, hereinafter, referred to as DCS processing 3).

Finally, the introduction of the DCS is halted, and a purge is performed with an introduction of the Ar only (a processing step 7 in FIG. 1).

Figure 2:
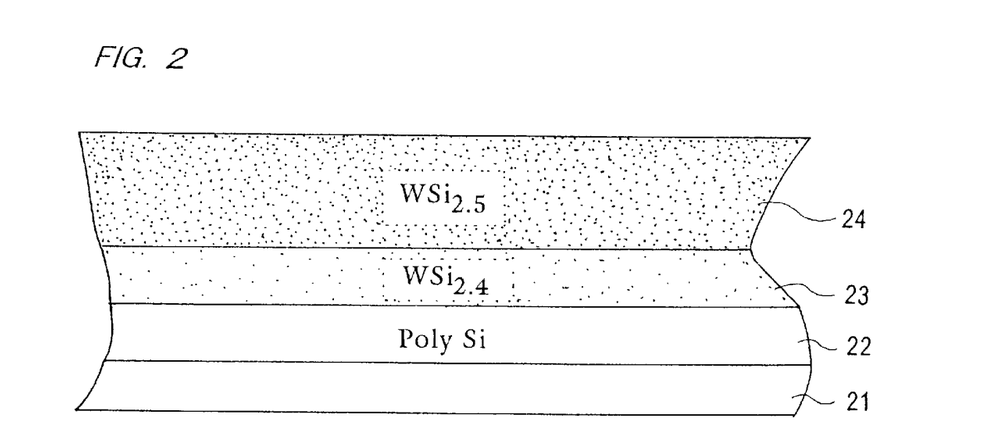
FIG. 2 is a diagram showing a configuration of a device in which a tungsten silicide film is formed according to the first embodiment of the present invention.

FIG. 2 is a diagram showing a configuration of a device to which applied actually is the method of forming the tungsten silicide film according to the present embodiment. The explanation will be given below, referring to FIG. 2.

A polysilicon (Poly Si) 22 is formed on a Si wafer 21, and a simple surface processing is performed on the polysilicon 22 by the DCS processing 1. An infinitesimal quantity of Si is left on a molecular level on the interface by the surface processing, but this does not have enough thickness to indicate in FIG. 2. Next, the $DCS/WF_6$ introduction-deposition processing step 1 is performed to form a tungsten silicide ($WSi_x$) 23 by 100 Å.

Further, the DCS processing 2 is performed, and following this, the DCS/WF$_6$ introduction-deposition 2 is carried out, thus forming a tungsten silicide (WSi$_x$) 24 by 600 Å, the constituent of which is different from the former. Next, after the DCS processing 3 is carried out, the purge is performed. The employment of this kind of configuration resulted in stable characteristics, and, in particular, the best characteristic was obtained from a configuration that, after the film forming is completed, the films are formed in the order of the polysilicon (Poly Si)/WSi2.4/WSi2.5 from the lower.

As described above, in the present embodiment, a tungsten-high constituting layer is deposited on an interface with a silicon wafer, and a tungsten-low constituting layer is deposited on the tungsten-high constituting layer to form the tungsten silicide film.

Also, it is desirable to form the tungsten silicide film so that the ratio in number between tungsten atoms and silicon atoms in the tungsten silicide film falls in a range of 2.2 to 2.4 in the tungsten-high constituting layer, and becomes not less than 2.5 in the tungsten-low constituting layer.

Incidentally, each of the embodiments explained hereinafter makes it possible to obtain a tungsten silicide film the configuration of which is almost the same as the one shown in FIG. 2. Therefore, the configuration of the film will be represented by the present embodiment only.

Mentioned below are some of the characteristics of the film forming process according to the present embodiment.

First, the DCS processing 1 and the DCS/WF$_6$ introduction-deposition 1 are carried out at an atmospheric pressure which is 1.5 to 3.0 times as much as an atmospheric pressure in the temperature raising processing step, the DCS processing 2 and the DCS/WF$_6$ introduction-deposition 2.

Also, the mixture ratio of the WFE to the DCS in the DCS/WF$_6$ introduction-deposition 1 is set to be in a range of 1:300 through 1:500, and the mixture ratio of the WF$_6$ to the DCS in the DCS/WF$_6$ introduction-deposition 2 is set to be in a range of 1:30 through 1:50.

Further, the introduced quantity of the DCS in the DCS processing 2 is set to be substantially equal to that in the DCS/WF$_6$ introduction-deposition 2.

Furthermore, a flow quantity ratio of the DCS between the DCS/WF$_6$ introduction-deposition 1 and the DCS/WF$_6$ introduction-deposition 2 is set to be in a range of 1:1 through 5:1. More preferably, it is set to be in a range of 3:1 through 5:1.

Incidentally, in the present application, a mixture ratio of liquids is expressed by the weight ratio, and a mixture ratio of gases is expressed by the flow quantity ratio or the volume ratio, which is not indicated every time they are referred to.

The present embodiment described above makes it possible to improve a stability in a film forming of a tungsten silicide film, to form a tungsten silicide film which is superior in adhesive property to a silicon wafer, to form a tungsten silicide film which is uniform over the whole surface of a silicon wafer, and further to obtain a tungsten silicide film not causing a film peeling.

Second Embodiment

Figure 3:
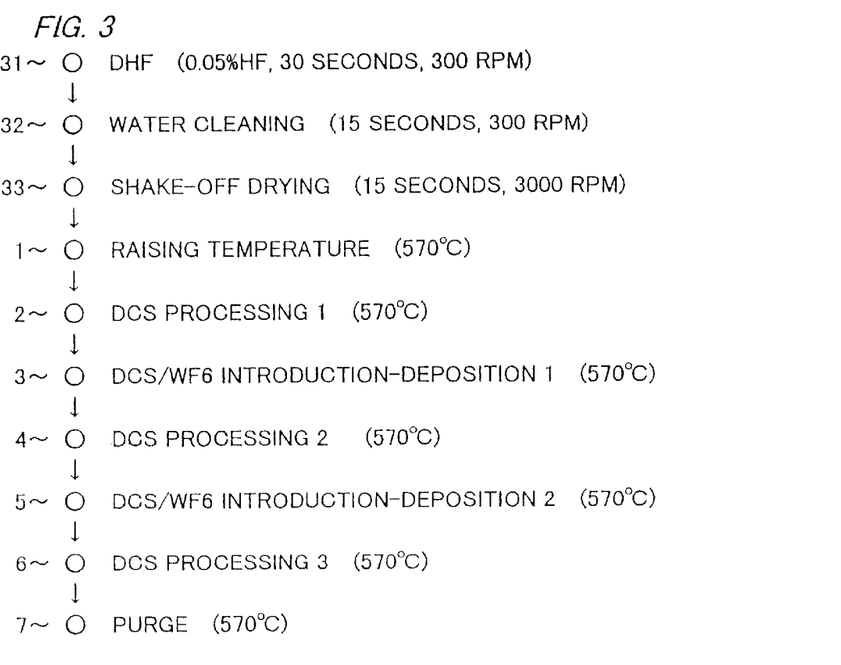
FIG. 3 is a process flow chart for describing a method of forming a tungsten silicide film according to a second embodiment of the present invention.

FIG. 3 is a process flow chart for describing a method of forming a tungsten silicide film according to a second embodiment of the present invention.

The present embodiment relates to a process of adjusting, in forming the tungsten silicide (WSi$_x$) film on polysilicon (Poly Si), a surface of the polysilicon (Poly Si) in advance so that DCS decomposes easily.

Referring to FIG. 3, the description will be given below concerning a forming process of the tungsten silicide film.

First, the polysilicon (Poly Si) is formed on a wafer (not illustrated).

With the wafer being rotated at 300 rpm, 0.05% dilute Hydrofluoride (DHF: dilute Hydrofluoride. hereinafter, referred to as DHF) is dropped from above (a processing step 31 in FIG. 3). According to an experiment, it has been judged from a contact angle that a natural oxide film on the polysilicon (Poly Si) has been eliminated enough when a substantial contact time between the polysilicon (Poly Si) surface and the DHF reaches 30 minutes.

In a prior art, after the elimination of the natural oxide film made by the DHF, a water cleaning is carried out so as to remove the HF from the polysilicon (Poly Si) surface. After that, even further water cleaning is added or continued, thus replacing and removing even the fluorine (F) constituent bound to the Si and existing on the surface. In the present embodiment, however, the water cleaning time is shortened, thereby intentionally leaving the F constituent on the surface (a processing step 32 in FIG. 3). More concretely, in the prior art, the water cleaning time was usually set to be 300 seconds, but in the present embodiment, it is set to be, for example, 15 seconds.

When the water cleaning thus shorten is over, the number of the rotation is increased up to 3000 rpm so as to perform a shake-off drying (a processing step 33 in FIG. 3).

According to an experiment, it is concluded in the later estimation that about 17% Si bonds on the surface are terminated with fluorine (F).

The wafer, with the surface maintained, is loaded into an inert gas, and after the temperature raising, DCS is introduced to carry out DCS processing 1. At this time, there remains the F on the wafer surface, and consequently the DCS decomposes stably on the uppermost surface. This has allowed an extremely infinitesimal quantity of Si family sites to remain, and the tungsten silicide (WSi$_x$) formed directly above the Si family sites shows improved adhesive property to the polysilicon (Poly Si).

Afterwards, the processing steps shown in the first embodiment was repeated, and a reproducibility of the film forming has turned out to be excellent.

Figure 4:
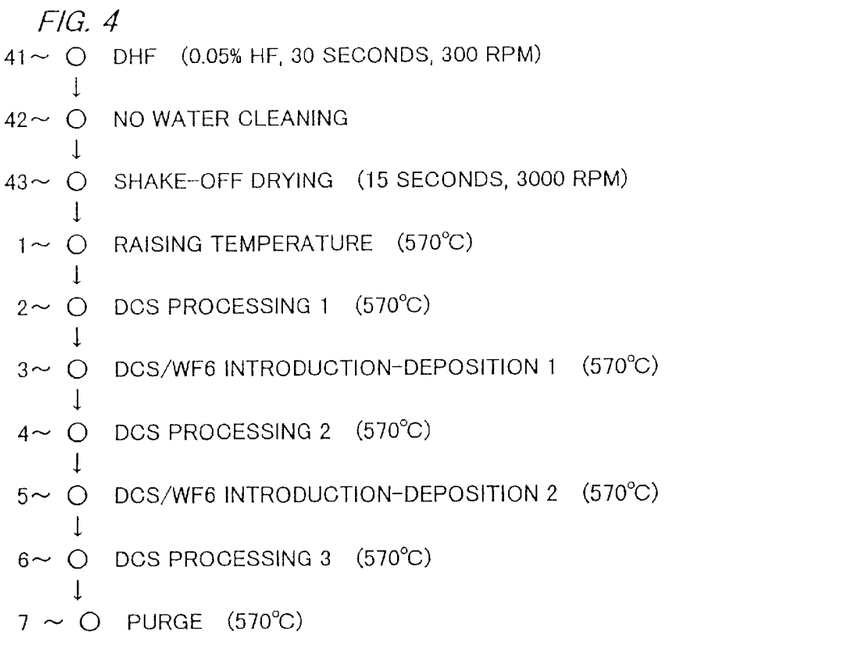
FIG. 4 is a diagram showing a process flow chart based on a modification of the second embodiment of the present invention.

FIG. 4 is a diagram showing a process flow based on a modification of the present embodiment. The modified embodiment, after an elimination of a natural oxide film made by DHF (a processing step 41 in FIG. 4), includes, as an example in which the processing is accelerated even faster, a process of not performing a water cleaning (a processing step 42 in FIG. 4) and a process of shaking-off and drying the DHF with the rotation (a processing step 43 in FIG. 4). In this method, too, a desirable result has been obtained as is the case with the occasion in which the water cleaning is shortened.

The DHF processing in the present embodiment is not limited to a single wafer processing.

As mentioned above, in the present embodiment, the surface processing steps, preceding the DCS processing 1, are carried out in order to process the silicon wafer surface into a surface state in which the DCS decomposes easily. Also, the surface state is made into a terminate of the Si by means of the F. This stabilizes the film forming processes, thus making it possible to form the tungsten silicide film of superior adhesive property.

Third Embodiment

Figure 5:
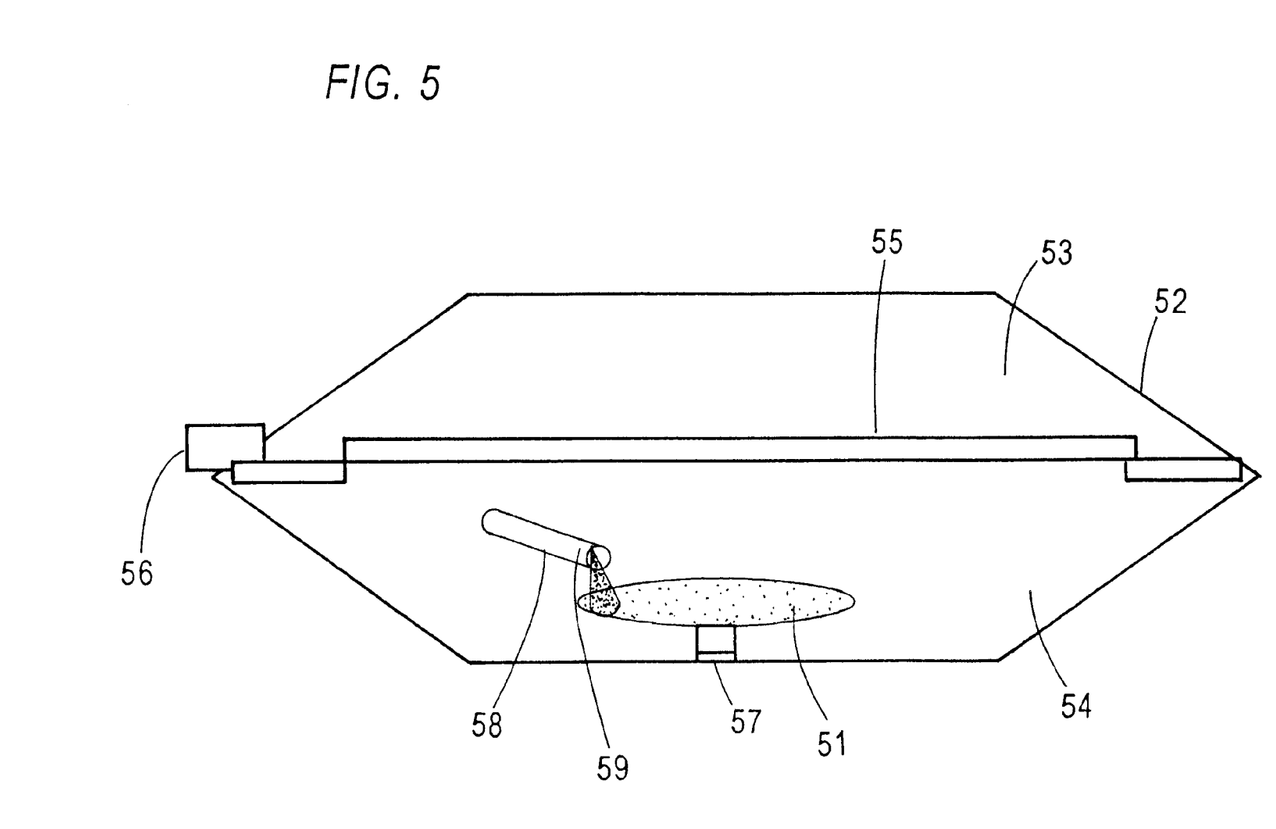
FIG. 5 is a cross sectional view illustrating a summary of a semiconductor wafer processing apparatus for forming a tungsten silicide film in accordance with a third embodiment of the present invention.
Figure 6:
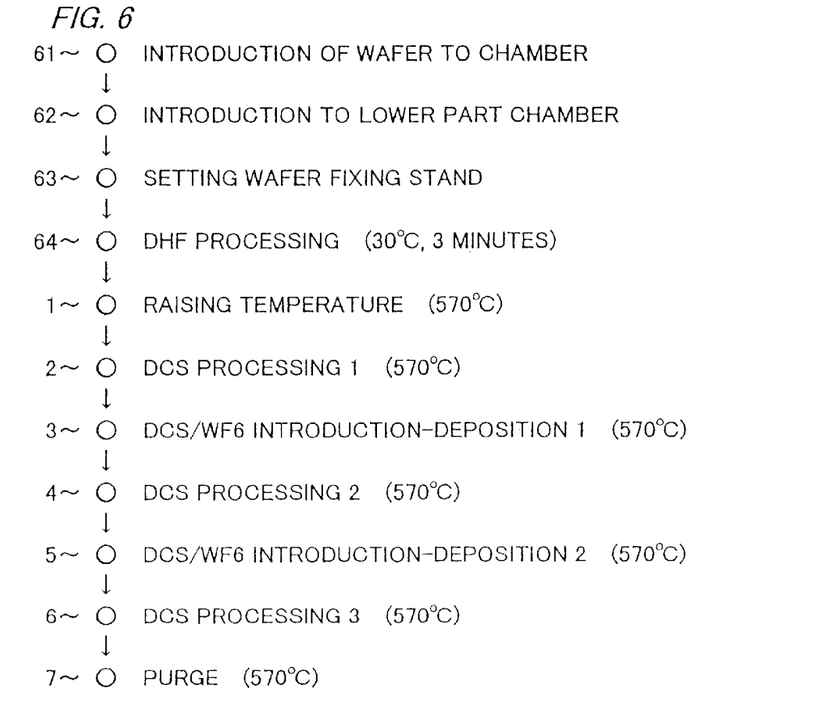
FIG. 6 is a process flow chart for describing a method of forming a tungsten silicide film according to the third embodiment of the present invention.

FIG. 5 is a cross sectional view illustrating an outline of a semiconductor wafer processing apparatus for forming a tungsten silicide film in accordance with a third embodiment of the present invention. FIG. 6 is a process flow chart for describing a method of forming a tungsten silicide film according to the third embodiment of the present invention.

The present embodiment relates to a process and a device of adjusting, in forming the tungsten silicide (WSi$_x$) film on polysilicon (Poly Si), a surface of the polysilicon (Poly Si) in advance so that DCS decomposes easily.

Referring to FIGS. 5 and 6, the description will be given below concerning a forming process of the tungsten silicide film.

First, the polysilicon (Poly Si) is formed on a wafer 51. The wafer 51 is introduced into a processing chamber 52 (a processing step 61 in FIG. 6). Actually, the chamber 52 consists of two parts, which are respectively referred to as, for example, an upper part chamber 53 (a first chamber) and a lower part chamber 54 (a second chamber).

The upper part chamber 53 and the lower part chamber 54 are separated from each other by a movable wall 55 (a separating means).

The wafer 51 is introduced into the chamber 52 from a loader 56, and is introduced into the lower part chamber 54 (a processing step 62 in FIG. 6), and is sealed by the movable wall 55. In the lower part chamber 54, provided is a wafer fixing stand 57 (a supporting means) for fixing and rotating the wafer 51. The wafer 51 is supported by the wafer fixing stand 57 (a processing step 63 in FIG. 6).

Furnished at the same time in the lower part chamber 54 is a chemical discharging pipe 58 (a chemical introducing means), which moves so that an outlet 59 of the chemical discharging pipe 58 are situated directly above the wafer 51. The wafer fixing stand 57 starts to rotate, and when the number of the rotation becomes a constant value of 300 rpm, 0.05% DHF (dilute Hydrofluoride) is dropped from above (a processing step 64 in FIG. 6). Incidentally, provided but not illustrated is a controlling means for controlling the kind of chemicals or processing gases to be introduced and their introducing period.

The number of the rotation is determined by a ratio between a hydrophilic area and a hydrophobic area on the wafer, a flatness including a level difference, and a diameter of the wafer. In the case of a device to which the present embodiment is applied, the number of the rotation of 300 rpm turns out to be suitable from the viewpoint of a penetration of the chemicals and a uniformity of the etching.

A natural oxide film on the polysilicon (Poly Si) is eliminated enough at a time when a substantial contact time between the polysilicon (Poly Si) surface and the DHF reaches 30 minutes, and then the discharge of the chemicals from the chemical discharging pipe 58 is halted to increase the number of the rotation of the wafer fixing stand 57 up to 3000 rpm, thus performing the shake-off drying.

The wafer 51, with the surface maintained, is loaded into the upper part chamber 53 by opening the movable wall 55. Then, the movable wall 55 is closed, and argon (Ar) is rapidly introduced.

After that, the processing steps shown in first embodiment are carried out.

Additionally, the processing device shown in FIG. 5 is available in other embodiments, too, and hereinafter FIG. 5 is appropriately referred to.

Fourth Embodiment

Figure 7:
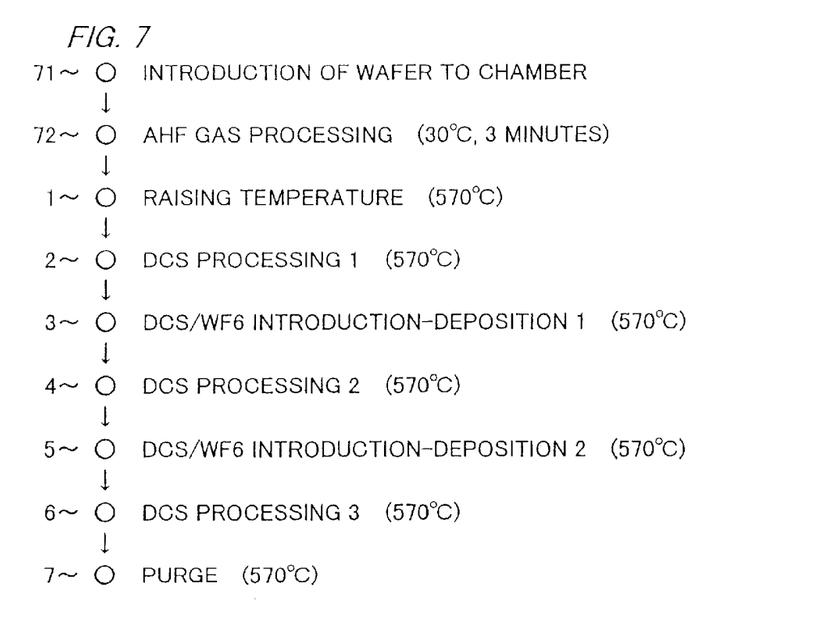
FIG. 7 is a process flow chart for describing a method of forming a tungsten silicide film according to a fourth embodiment of the present invention.

FIG. 7 is a process flow chart for describing a method of forming a tungsten silicide film according to a fourth embodiment of the present invention.

The present embodiment relates to a process of adjusting a surface of the polysilicon (Poly Si) using AHF (Anhydrous Hydro Fluoride) in advance so that DCS decomposes easily, when forming the tungsten silicide (WSi$_x$) film on polysilicon (Poly Si).

Referring to FIG. 7, the description will be given below concerning a forming process of the tungsten silicide film. Regarding a processing device, FIG. 5 is referred to.

First, the polysilicon (Poly Si) is formed on a wafer 51 (not illustrated).

The wafer 51 is introduced into a processing chamber 52 (a processing step 71 in FIG. 7). The wafer 51 is introduced from a loader 56 into the chamber 52, and is then sealed.

In the chamber, the AHF gas sufficiently eliminates a natural oxide film on the polysilicon (Poly Si) surface on the wafer 51 (a processing step 72 in FIG. 7). At a time when the natural oxide film has been eliminated enough, the processing steps shown in first embodiment is performed with the surface maintained.

An experiment has shown that, immediately after the AHF gas processing, not less than 20% of the processed wafer surface has been terminated by the fluorine (F). This result enjoys a terminal rate higher than that indicated in second embodiment, and thus it is considered to bring about a superior effect. As a consequence of the actual film forming, a reliability on the adhesive property, as intended, has been found to be excellent.

Additionally, although the above-mentioned description has been given regarding a case using the AHF gas, employed as the processing gas can be NF$_3$ gas or ClF$_3$ gas, in addition to HF gas to be explained hereinafter.

Fifth Embodiment

Figure 8:
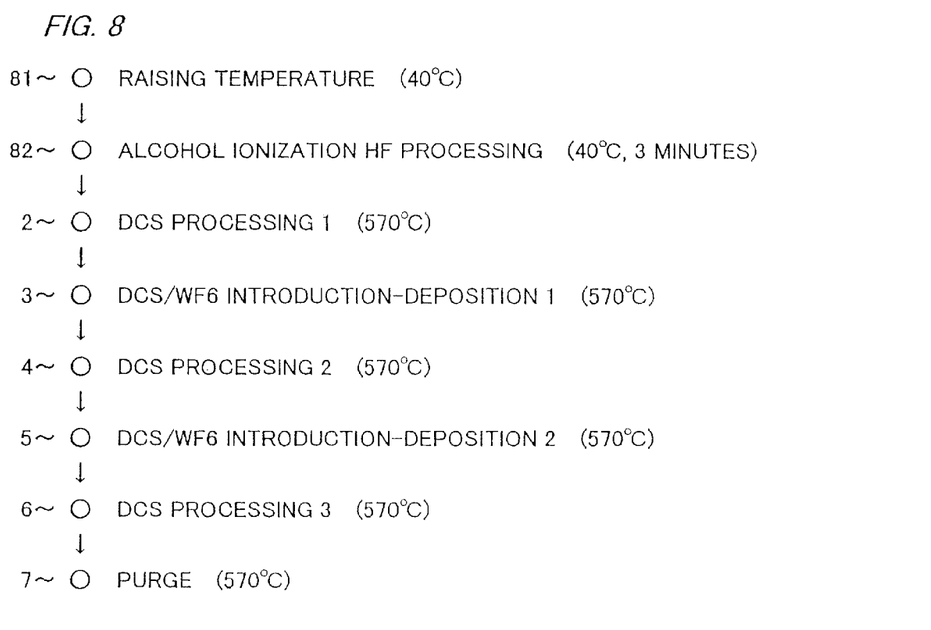
FIG. 8 is a process flow chart for describing a method of forming a tungsten silicide film according to a fifth embodiment of the present invention.

FIG. 8 is a process flow chart for describing a method of forming a tungsten silicide film according to a fifth embodiment of the present invention.

In the fourth embodiment, the extremely high adhesive stability has been obtained. In the case of using the AHF, however, there has occurred, in some cases, a delay time until a starting of an etching of the oxide film. This results from the fact that a reaction (a) in which the AFH etches SiO$_2$ is as follows.

$$4HF+2SiO_2 \rightarrow SiF_4+2H_2O \text{ (a)},$$

Thus it is needed to add H$_2$O as the starting agent.

Fifth embodiment is an embodiment improved for solving the problem of the delay time and obtaining an even better process.

Referring to FIG. 8, the description will be given below concerning a forming process of the tungsten silicide film.

First, the temperature of a wafer is appropriately raised (a processing step 81 in FIG. 8). Then, the AHF is ventilated into IPA, and the AHF is ionized in advance by the time it reaches the wafer surface (a processing step 82 in FIG. 8). The introduction of this ionized HF gas makes it possible to substantially eliminate the delay time, thus obtaining a more uniform natural oxide film elimination.

Following this, the method in first embodiment is applied, thereby making it possible to form a uniform film of the tungsten silicide (WSi$_x$) over the whole wafer surface.

Sixth Embodiment

Figure 9:
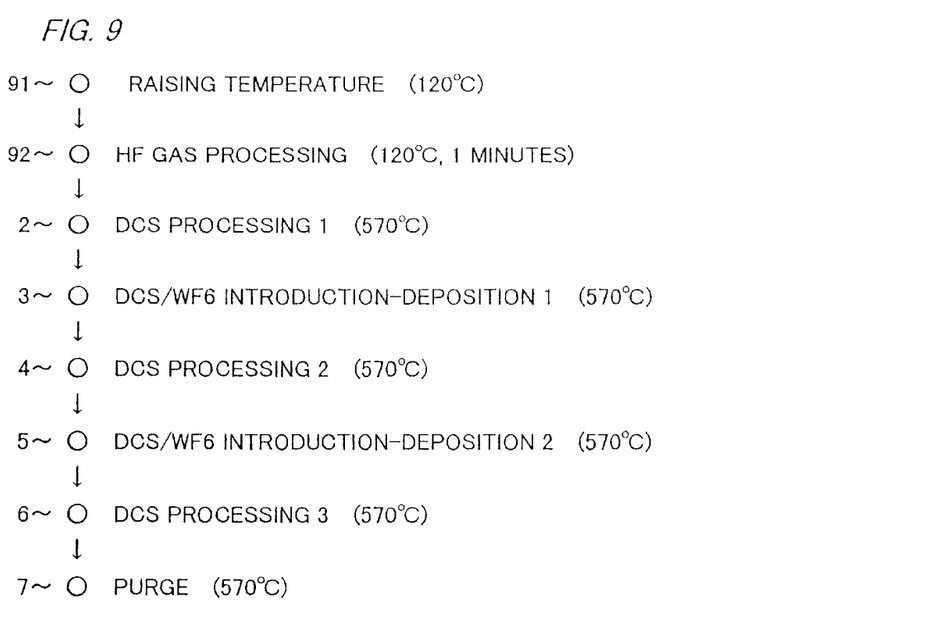
FIG. 9 is a process flow chart for describing a method of forming a tungsten silicide film according to a sixth embodiment of the present invention.

FIG. 9 is a process flow chart for describing a method of forming a tungsten silicide film according to a sixth embodiment of the present invention.

Fourth and fifth embodiments have made it possible to provide processes stable enough for a device manufacturing at the present time. The purpose of sixth embodiment is to provide a process with a margin for products now under development, and products in the near future.

Referring to FIG. 9, the description will be given below concerning a forming process of the tungsten silicide film.

Generally speaking, in a chemical reaction, a reaction rate increases exponentially with temperature. In the present embodiment, a wafer 51 is loaded in a chamber 52, and after sealing the wafer, the film forming is started, and at that time the temperature is raised up to, for example, 120° C. (a processing step 91 in FIG. 9). HF gas is ventilated at this raised temperature, thereby performing a natural oxide film elimination on the surface and at the same time making the bonds on the surface terminated with fluorine (F) (a processing step 92 in FIG. 9).

Performed following this are the processing steps explained in first embodiment. This makes it possible to form a tungsten silicide film with a high adhesive property in a shorter processing time.

Incidentally, in the above-stated example, HF gas is ventilated at a raised temperature, but the HF gas may be ventilated under a reduced pressure and/or at a raised temperature.

Seventh Embodiment

Figure 10:
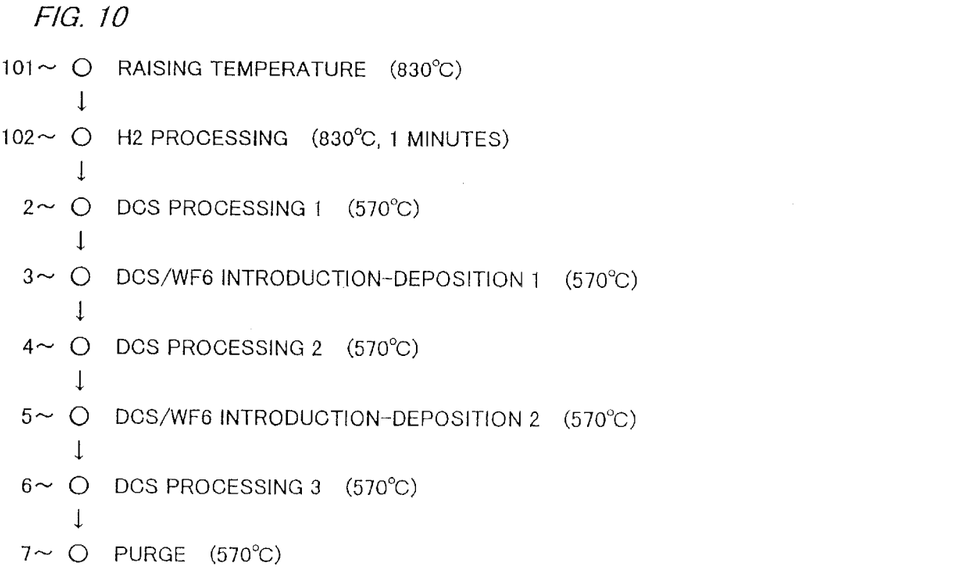
FIG. 10 is a process flow chart for describing a method of forming a tungsten silicide film according to a seventh embodiment of the present invention.

FIG. 10 is a process flow chart for describing a method of forming a tungsten silicide film according to a seventh embodiment of the present invention.

It is generally considered that, in order to avoid a diffusion of impurities such as metals in a semiconductor and an occurrence of stresses therein, a semiconductor manufacturing process should be performed at the lowest temperature possible. The above-mentioned embodiment aims at executing the natural oxide film elimination processing at the lowest temperature possible.

However, it is assumed that, depending on circumstances, a heating process not exceeding about 850° C. will not exert so serious and adverse influence.

The present embodiment aims at executing the natural oxide film elimination processing at a raised temperature, thus obtaining a uniform and clean surface of a wafer.

Referring to FIG. 10, the description will be given below concerning a forming process of the tungsten silicide film.

In the present embodiment, a wafer 51 is loaded in a chamber 52, and after sealing it, the film forming is started, and at that time the temperature is first raised up to, for example, 830° C. (a processing step 101 in FIG. 10). $H_2$ gas is ventilated at this raised temperature, and the processing is carried out for about one minutes (a processing step 102 in FIG. 10). This step performs a natural oxide film elimination on the surface and at the same time makes the bonds on the surface terminated with H. Performed immediately next to this are the processing steps explained in first embodiment. This makes it possible to form a tungsten silicide ($WSi_x$) film with a high adhesive property in a shorter processing time.

Incidentally, in the above-stated example, $H_2$ gas is ventilated at a raised temperature, but the $H_2$ gas may be ventilated under a reduced pressure and/or at a raised temperature of 830° C.

The present embodiment deals with a hydrogen gas at a high temperature and thus requires a care for safety. At the same time, however, the embodiment makes the wafer surface terminated completely at the hydrogen gas to obtain a uniform and clean surface, thus resulting in an effect of smoothly performing an initial deposition of the tungsten silicide ($WSi_x$) over the Si surface.

In addition, although the $H_2$ gas processing is carried out with the temperature raised at 830° C. in the above-stated description, the $H_2$ gas processing is generally effective in a raised temperature range of 300° C. to 850° C.

Also, shown in the present embodiment is an example of performing the DCS processing 1 after the $H_2$ gas processing, but it is allowable to perform, omitting the DCS processing 1, the DCS/$WF_6$ introduction-deposition 1 after the $H_2$ gas processing.

Eighth Embodiment

Figure 11:
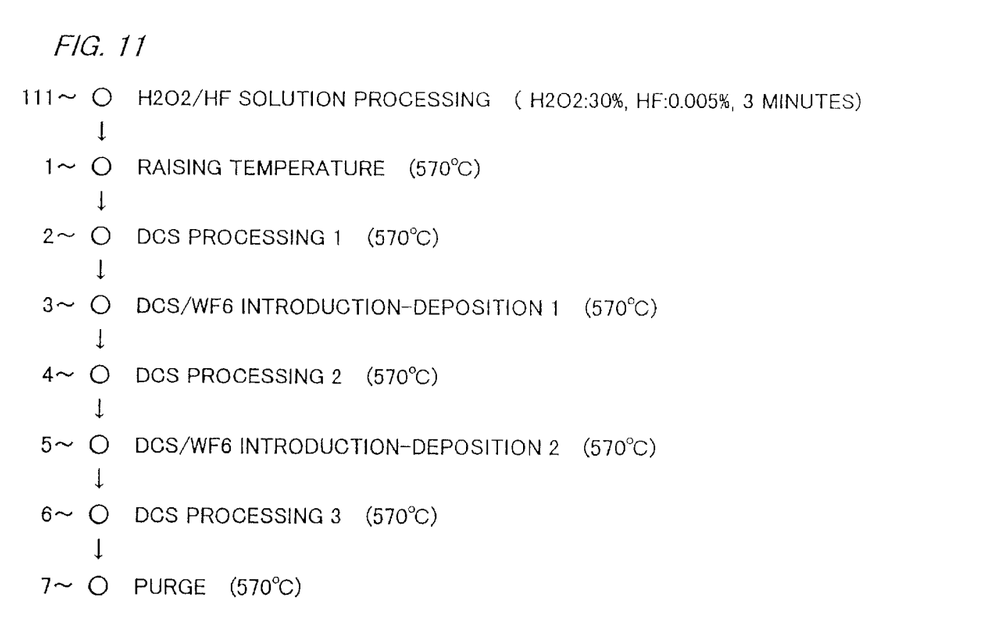
FIG. 11 is a process flow chart for describing a method of forming a tungsten silicide film according to a eighth embodiment of the present invention.

FIG. 11 is a process flow chart for describing a method of forming a tungsten silicide film according to an eighth embodiment of the present invention.

The present embodiment relates to a process of, intentionally in advance, covering a surface of the polysilicon (PolySi) uniformly with a chemical oxide film, when forming the tungsten silicide ($WSi_x$) film on polysilicon (Poly Si).

A problem in a conventional method of forming the tungsten silicide (WSiX) film was as follows: When introducing chemicals such as $WF_6$ and starting a deposition of the tungsten silicide ($WSi_x$), a natural oxide film, which is to grow after a wet cleaning such as RCA cleaning has been finished, does not grow uniformly and evenly over the surface. This creates on the same Si surface both an area in which the tungsten silicide ($WSi_x$) begins to deposit and an area in which the tungsten silicide ($WSi_x$) does not begin to deposit soon. Accordingly, it became impossible for the film to deposit uniformly, thus bringing about a cause of phenomena such as a film peeling.

The present embodiment aims to prevent this phenomena and to deposit the film uniformly.

Referring to FIG. 11, the description will be given below concerning a forming process of the tungsten silicide film. Regarding a processing device, FIG. 5 is referred to.

In the present embodiment, a wafer 51 on which the polysilicon (Poly Si) is formed is coated with a chemical containing $H_2O_2$ the content of which is 30% and at the same time containing 0.005% HF (a processing step 111 in FIG. 11). This step makes it possible to perform a natural oxide film elimination on the surface and further to compulsorily carry out a formation of a chemical oxide film, thus uniformly forming on the surface the chemical oxide film consisting of several atomic layers.

Explaining the process concretely, the wafer 51 on which the polysilicon (Poly Si) is formed is introduced into a chamber 52 from a loader 56, and is then sealed. A movable wall 55 is opened. The wafer 51 is guided into a lower part chamber 54, and is supported by a wafer fixing stand 57. Then, the movable wall 55 is sealed.

With the wafer 51 being rotated, the wafer is coated with the chemical containing $H_2O_2$ the content of which is 30% and at the same time containing 0.005% HF from a chemical discharging pipe 58. Preferably, the wafer 51 is kept contacting the chemical for substantially 3 minutes so that a uniform chemical oxide film is formed over the whole surface thereof.

Then, the number of rotation of the wafer fixing stand 57 is increased up to 3000 rpm so as to perform the shake-off drying.

Next, the movable wall 55 is opened, the wafer 51 is inserted into an upper part chamber 53, and is sealed by the movable wall 55. After that, the processing steps shown in first embodiment are executed to carry out the film forming.

In the present embodiment, the deposition of the tungsten silicide ($WSi_x$) has turned out to be successful from its early stage. The inventors et al. have thought that this results from the following two reasons: the concentration condition in the present embodiment has allowed the wafer surface to eventually have a uniform property as a whole, and an infinitesimal F constituent remains in the chemical oxide film, which has promoted a site formation of Si by means of the first DCS onto the surface.

Also, in the prior art, after a pretreatment process, extremely infinitesimal organic substances are absorbed onto the surface from the surroundings such as an air and come to exist on the interface between the polysilicon (Poly Si) and the tungsten silicide ($WSi_x$), which has caused a film peeling or a failure in film formation. The inventors et al. have thought, however, that the chemical processing according to the present embodiment makes it possible to solve the problem in the prior art, thus having improved a film forming stability even further.

Incidentally, experimental examples have proved it advisable, preceding to the $DCS/WF_6$ introduction-deposition 2, to cover the uppermost silicon wafer with $SiO_2$ the thickness of which is substantially in a range of one molecular layer to 1.8 nm.

In the above-mentioned examples, the mixed solution of $H_2O_2$ and HF has been employed as a chemical in the present embodiment, but instead of this mixed solution, the same effect has been obtained by employing 0.005% HF concentration chemical containing 10 ppm ozone.

Ninth Embodiment

Figure 12:
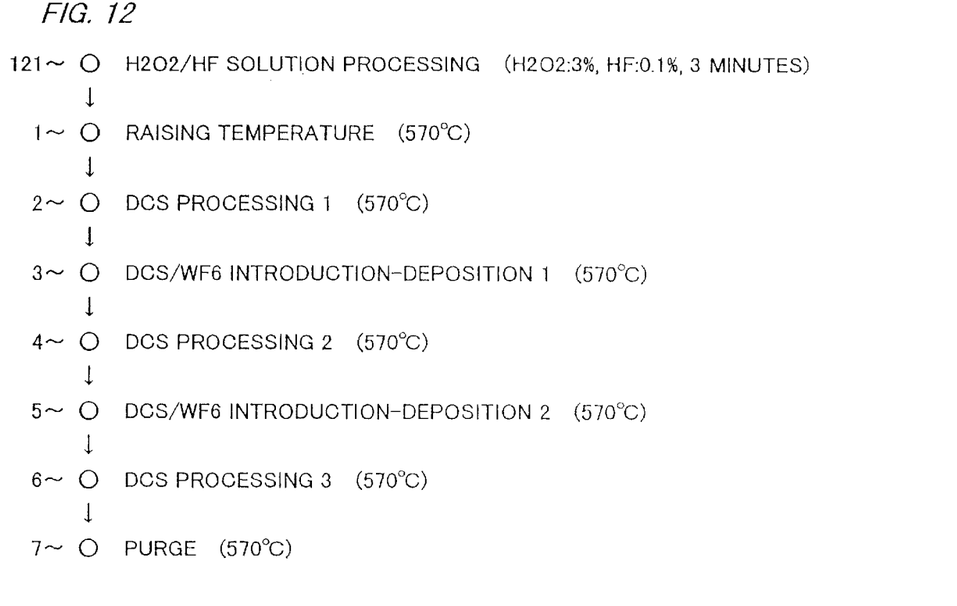
FIG. 12 is a process flow chart for describing a method of forming a tungsten silicide film according to a ninth embodiment of the present invention.

FIG. 12 is a process flow chart for describing a method of forming a tungsten silicide film according to a ninth embodiment of the present invention.

The present embodiment relates to a process to form a uniform chemical oxide film over a surface of the polysilicon (Poly Si) and then eliminate the uniform chemical oxide film in advance when forming a tungsten silicide ($WSi_x$) film on polysilicon (Poly Si), by which the exposed surface of a polysilicon (Poly Si) is made extremely clean and uniform as a result of the etching over several atomic layers.

In much the same way as eighth embodiment, a problem in a conventional method of forming the tungsten silicide ($WSi_x$) film was as follows: When introducing chemicals such as $WF_6$ and starting a deposition of the tungsten silicide ($WSi_x$), a natural oxide film, which is to grow after a wet cleaning such as RCA cleaning has been finished, does not grow uniformly and evenly over the surface. This creates on the same Si surface both an area in which the tungsten silicide ($WSi_x$) begins to deposit and an area in which the tungsten silicide ($WSi_x$) does not begin to deposit soon. Accordingly, it became impossible for the film to deposit uniformly, thus bringing about a cause of phenomena such as a film peeling.

The present embodiment aims to prevent this phenomena and to deposit the film uniformly.

Referring to FIG. 12, the description will be given below concerning a forming process of the tungsten silicide film. Regarding a processing device, FIG. 5 is referred to.

In the present embodiment, a wafer 51 on which the polysilicon (Poly Si) is formed is coated with a chemical containing $H_2O_2$ the content of which is 3% and at the same time containing 0.1% HF (a processing step 121 in FIG. 12). This step makes it possible to compulsorily carry out a formation of a chemical oxide film on the wafer surface, while uniformly forming a chemical oxide film consisting of several atomic layers, to eliminate the chemical oxide film by simultaneously adding an etchant having a higher etch rate, and finally to expose a polysilicon (Poly Si) on the surface of which fluorine (F) remains.

Explaining the process concretely, the wafer 51 on which the polysilicon (Poly Si) is formed is introduced into a chamber 52 from a loader 56, and is then sealed. A movable wall 55 is opened. The wafer 51 is guided into a lower part chamber 54, and is supported by a wafer fixing stand 57. Then, the movable wall 55 is sealed.

With the wafer 51 being rotated, the wafer is coated with the chemical containing $H_2O_2$ the content of which is 3% and at the same time containing 0.1% HF from a chemical discharging pipe 58. Preferably, the wafer 51 is kept contacting the chemical for substantially 3 minutes so that a uniform chemical oxide film is formed over the whole surface thereof.

Then, the number of rotation of the wafer fixing stand 57 is increased up to 3000 rpm so as to perform the shake-off drying.

Next, the movable wall 55 is opened, the wafer 51 is inserted into an upper part chamber 53, and is sealed by the movable wall 55. After that, the processing steps shown in first embodiment are executed to carry out the film forming.

In the present embodiment, the deposition of the tungsten silicide ($WSi_x$) has turned out to be successful from its early stage. The inventors of the present invention have thought that this results from the following two reasons: the concentration condition in the present embodiment has allowed the wafer surface to eventually have a uniform property as a whole, and more of an infinitesimal fluorine (F) constituent remains on the surface than the case in eighth embodiment, which has promoted a site formation of Si by means of the first DCS onto the surface.

Also, in the prior art, after a pretreatment process, extremely infinitesimal organic substances are absorbed onto the surface from the surroundings such as an air and come to exist on the interface between the polysilicon (Poly Si) and the tungsten silicide ($WSi_x$), which has caused a film peeling or a failure in film formation. The present inventors have thought, however, that the chemical processing according to the present embodiment makes it possible to solve the problem in the prior art, thus having improved a film forming stability even further.

Instead of the above-mentioned 3% $H_2O_2$ as a chemical to be employed in the present embodiment, the same effect has been obtained by applying a chemical containing 1 ppm ozone.

Additionally, the performing is possible using a chemical obtained by adding a small quantity of HF to a solution in which hydrogen peroxide and ozone are solved.

Tenth Embodiment

Figure 13:
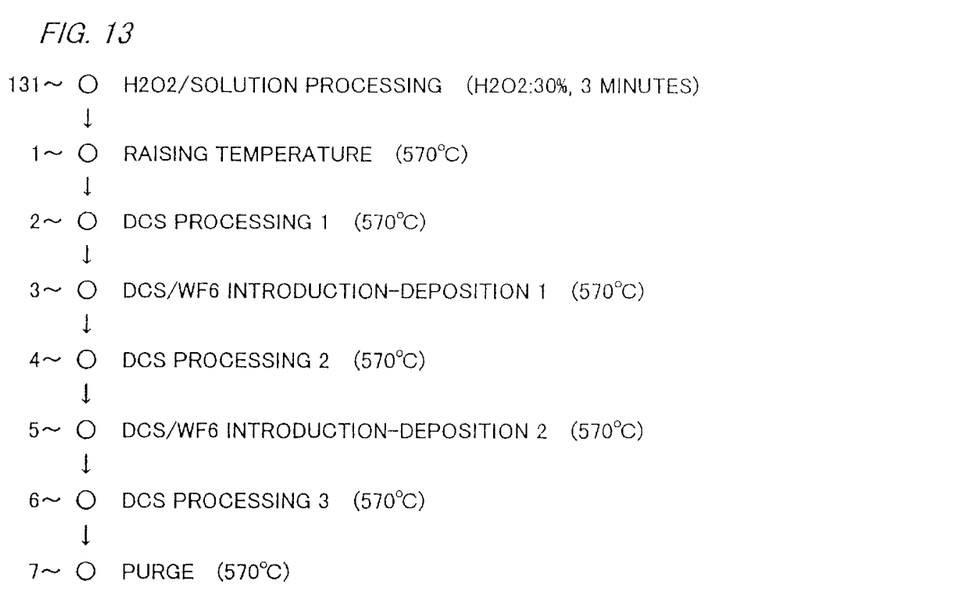
FIG. 13 is a process flow chart for describing a method of forming a tungsten silicide film according to a tenth embodiment of the present invention.

FIG. 13 is a process flow chart for describing a method of forming a tungsten silicide film according to a tenth embodiment of the present invention.

The present embodiment relates to a process to form a uniform chemical oxide film over a surface of the polysilicon (Poly Si) and then eliminate the uniform chemical oxide film in advance, when forming the tungsten silicide ($WSi_x$) film on polysilicon (Poly Si), by which the exposed surface of the polysilicon (Poly Si) is made extremely clean and uniform as a result of the etching over several atomic layers.

In much the same way as eighth and ninth embodiments, a problem in a conventional method of forming the tungsten silicide ($WSi_x$) film was as follows: When introducing chemicals such as $WF_6$ and starting a deposition of the tungsten silicide ($WSi_x$), a natural oxide film, which is to grow after a wet cleaning such as RCA cleaning has been finished, does not grow uniformly and evenly over the surface. This creates on the same Si surface both an area in which the tungsten silicide ($WSi_x$) begins to deposit and an area in which the tungsten silicide ($WSi_x$) does not begin to deposit soon. Accordingly, it became impossible for the film to deposit uniformly, thus bringing about a cause of phenomena such as a film peeling.

The present embodiment aims at preventing this so that the film will deposit uniformly.

Referring to FIG. 13, the description will be given below concerning a forming process of the tungsten silicide film. Regarding a processing device, FIG. 5 is referred to.

In the present embodiment, a wafer 51 on which the polysilicon (Poly Si) is formed is coated with a chemical containing only $H_2O_2$ the content of which is 30%. (a processing step 131 in FIG. 13). This step makes it possible to compulsorily carry out a formation of a chemical oxide film on the wafer surface, thus forming the chemical oxide film consisting of several atomic layers.

Explaining the process concretely, the wafer 51 on which the polysilicon (Poly Si) is formed is introduced into a chamber 52 from a loader 56, and is then sealed. A movable wall 55 is opened. The wafer 51 is guided into a lower part chamber 54, and is supported by a wafer fixing stand 57. Then, the movable wall 55 is sealed.

With the wafer 51 being rotated, the wafer is coated with the chemical containing $H_2O_2$ the content of which is 30% from a chemical discharging pipe 58. Preferably, the wafer 51 is kept contacting the chemical for, substantially, 3 minutes so that a uniform chemical oxide film is formed over the whole surface thereof.

Then, the number of rotation of the wafer fixing stand 57 is increased up to 3000 rpm so as to perform the shake-off drying.

Next, the movable wall 55 is opened, the wafer 51 is inserted into an upper part chamber 53, and is sealed by the movable wall 55. After that, the processing steps shown in first embodiment are executed to carry out the film forming.

In the present embodiment, the deposition of the tungsten silicide ($WSi_x$) has turned out to be successful from its early stage. The inventors et al. have thought that this results from a reason that the concentration condition in the present embodiment has allowed the wafer surface to eventually have a uniform property as a whole.

Also, in the prior art, after a pretreatment process, extremely infinitesimal organic substances are absorbed onto the surface from the surroundings such as an air and come to exist on the interface between the polysilicon (Poly Si) and the tungsten silicide ($WSi_x$), which has caused a film peeling or a failure in film formation. The inventors et al. have thought, however, that the chemical processing according to the present embodiment makes it possible to solve the problem in the prior art, thus having improved a film forming stability even further.

Instead of the above-mentioned 30% $H_2O_2$ as a chemical to be employed in the present embodiment, the same effect has been obtained by applying a chemical containing 10 ppm ozone.

Additionally, the performing is possible using a processing solution in which hydrogen peroxide and ozone are solved.

Eleventh Embodiment

Figure 14:
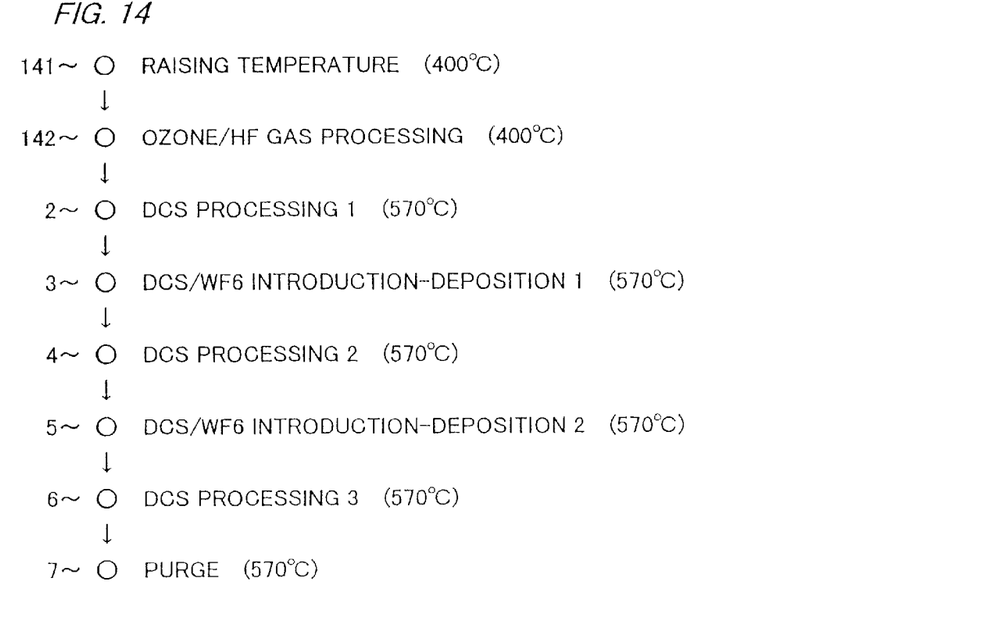
FIG. 14 is a process flow chart for describing a method of forming a tungsten silicide film according to an eleventh embodiment of the present invention.

FIG. 14 is a process flow chart for describing a method of forming a tungsten silicide film according to an eleventh embodiment of the present invention.

Eighth to tenth embodiments makes it possible to obtain a higher stability in forming the tungsten silicide film, which means that these embodiment are superior as a method or a technique. However, in some places where devices are installed in semiconductor manufacturing factory, there are not prepared enough facilities and environment for a wet cleaning.

The present embodiment aims at embodying, in a drying process, the processes embodied in the above-stated eighth to tenth embodiments.

Referring to FIG. 14, the description will be given below concerning a forming process of the tungsten silicide film.

A wafer 51 on which polysilicon (Poly Si) is formed is introduced into a chamber 52 from a loader 56, and is then sealed. After the sealed atmosphere is once replaced by an inert gas, the temperature is raised up to not greater than 450° C., for example, at 400° C. (a processing step 141 in FIG. 14). Then, a mixed gas of HF gas and ozone gas is introduced (a processing step 142 in FIG. 14). Concerning the temperature raising at this time, the higher the temperature is raised, the faster the reaction occurs, and the time needed tends to be shortened accordingly. However, if the temperature is raised too high, the reaction is progressed rapidly and the surface coarse level becomes higher, which is not so satisfactory. Performed after that are the DCS introduction and the following film forming processes shown in first embodiment.

In the present embodiment, the deposition of the tungsten silicide ($WSi_x$) has been performed successfully from its early stage, and the film forming stability has been improved.

The present embodiment, through the drying process, makes it possible to carry out a film forming of the tungsten silicide ($WSi_x$) more stably than in the prior art, suppressing an expensive additional cost related to the power and the environment. Also, the movement between the chambers can be omitted. This allows the whole processing time to be shortened, thus obtaining an effect of increasing the throughput and improving the productivity.

Incidentally, explained above is a case in which the mixed gas of the HF gas and the ozone gas is employed, but it is possible to use a mixed gas of oxygen gas and the HF gas, or a mixed gas of $H_2O$ vapor and the HF gas. Also, it is advisable to add the HF gas in a range of 0.001 to 0.5% to the ozone gas, the oxygen gas, or the $H_2O$ vapor.

Twelfth Embodiment

FIG. 14 is a process flow chart for describing a method of forming a tungsten silicide film according to an eleventh embodiment of the present invention.

Eleventh embodiment aims at realizing a cleaning of the wafer surface and a terminal of F using an equilibrium reaction between the oxidation and the etching by mixing the ozone gas with the HF gas. In the cases in which the polysilicon (Poly Si) contains P, however, the etching is promoted to increase the surface coarse level, and, contrary to the expectation, there has emerged a phenomenon in which the adhesive property deteriorates.

The present embodiment aims, in such cases, at embodying in the drying process the processes embodied in eighth to tenth embodiments, and at the same time at providing a process in which the film forming stability is improved.

Figure 15:
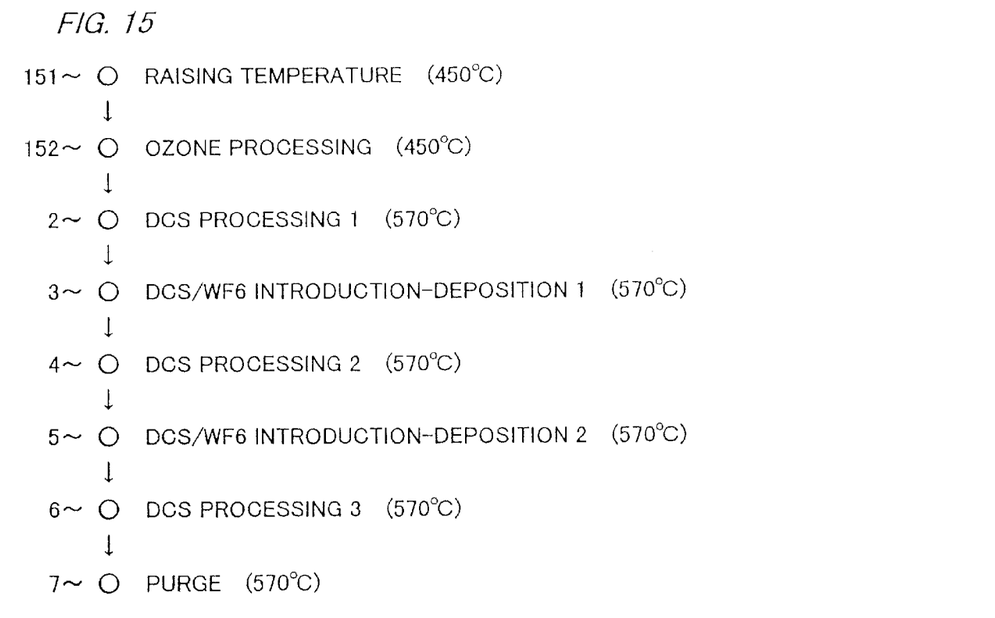
FIG. 15 is a process flow chart for describing a method of forming a tungsten silicide film according to a twelfth embodiment of the present invention.

Referring to FIG. 15, the description will be given below concerning a forming process of the tungsten silicide film.

A wafer 51 on which polysilicon (Poly Si) is formed is introduced into a chamber 52 from a loader 56, and is then sealed. After the sealed atmosphere is once replaced by an inert gas, the temperature is raised up to not greater than 450° C., for example, at 450° C. (a processing step 151 in FIG. 15). Then, not supplying HF gas, only ozone gas is introduced (a processing step 152 in FIG. 15). Performed after that are the DCS introduction and the following film forming processes shown in first embodiment.

As described above, in the present embodiment, performed preceding to the DCS introduction shown in first embodiment is only an elimination of organic substances and a formation of extremely thin oxide film by means of the ozone gas, not supplying the HF gas. It is recognized that this enables an adhesive property to be obtained even when the polysilicon (Poly Si) contains the P.

A similar effect has been obtained by changing the introduced gas from the ozone to the oxygen. The effect is more apparent in the case of the oxygen, but since the oxygen can be obtained easily on a semiconductor line, it is considered from a viewpoint of general purpose use that employing the oxygen, too, will make a lot of contribution to the production.

Furthermore, an introduction of water vapor has been tried. Although it is founded to be necessary to control a delicate flow quantity, a similar effect has been obtained. Accordingly, it is allowable to employ the water vapor instead of the ozone.

Thirteenth Embodiment

The methods of forming the tungsten silicide film described in each of the above-mentioned embodiments are available in and applicable to processes of manufacturing various types of semiconductor devices.

The film thus formed can be used effectively as a low resistance conduction film for interconnections such as gate electrodes, bit lines, and word lines in, for example, a memory unit in a semiconductor device.

The present invention includes any of the formations of the tungsten silicide film described above in semiconductor manufacturing process. Also, the present invention includes in a semiconductor device the tungsten silicide film formed by any of the forming methods described above.

As having been described above, the present invention makes it possible to improve a stability in forming a tungsten silicide film.

Also, the present invention makes it possible to form a tungsten silicide film of an excellent adhesive property toward a silicon wafer.

Moreover, the present invention makes it possible to form a tungsten silicide film which is uniform to the whole surface of a silicon wafer.

Furthermore, the present invention makes it possible to form a tungsten silicide film which causes no peeling thereof.

It is further understood that the foregoing description is a preferred embodiment of the disclosed device and that various changes and modifications may be made in the invention without departing from the spirit and scope thereof.

What is claimed is:

1. A method of forming a tungsten suicide film, the method comprising the following processes in the following order:
   a temperature raising process of disposing a silicon wafer in an inert gas atmosphere and raising the temperature thereof;
   a first dichlorosilane (DCS) treatment process of introducing DCS so as to generate a surface reaction of said silicon wafer;
   a first deposition process of introducing $WF_6$ in addition to the DCS so as to generate a surface reaction of said silicon wafer;
   a second DCS treatment process of shutting off the $WF_6$ and introducing the DCS; and
   a second deposition process of introducing $WF_6$ in addition to the DCS so as to deposit tungsten silicide.

2. The method of forming a tungsten silicide film, as defined in claim 1, wherein a surface of said silicon wafer is reduced through said temperature raising process and said first DCS treatment process.

3. The method of forming a tungsten silicide film, as defined in claim 1, wherein
   said first DCS treatment process and said first deposition process are performed at an atmospheric pressure which is 1.5 to 3.0 times as high as an atmospheric pressure in said temperature raising process, said second DCS treatment process, and said second deposition process.

4. The method of forming a tungsten silicide film, as defined in claim 1, wherein
   a mixture ratio between the $WF_6$ and the DCS in said first deposition process is in a range of 1:300 to 1:500, and
   a mixture ratio between the $WF_6$ and the DCS in said second deposition process is in a range of 1:30 to 1:50.

5. The method of forming a tungsten silicide film, as defined in claim 1,
   wherein an introduced quantity of the DCS in said second DCS treatment process is set to be substantially equal to that in said second deposition process.

6. The method of forming a tungsten silicide film, as defined in claim 1,
   wherein a flow quantity ratio of the DCS between said first deposition process and said second deposition process is set to be in a range of 1:1 to 5:1.

7. The method of forming a tungsten silicide film, as defined in claim 1,
   wherein, preceding said first DCS treatment process, performed is a surface treatment process of processing the surface of said silicon wafer into a surface state in which the DCS decomposes easily.

8. The method of forming a tungsten silicide film, as defined in claim 7,
   wherein said surface state has a termination of Si with fluorine (F).

9. The method of forming a tungsten silicide film, as defined in claim 7,
   wherein said surface treatment process comprises:
   a process of processing the surface of said silicon wafer with dilute hydrofluoride solution (DHF) the concentration of which is not less than 0.05%; and
   a process of drying the surface of said silicon wafer with F constituent left thereon.

10. The method of forming a tungsten silicide film, as defined in claim 7,
    wherein said surface treatment process comprises a process of processing the surface of said silicon wafer using any of gas phase HF, $NF_3$ or $ClF_3$.

11. The method of forming a tungsten silicide film, as defined in claim 1,
    wherein, instead of said temperature raising process, performed is a treatment process of processing said silicon wafer using $H_2$ gas in a range of 300° C. to 850° C.

12. The method of forming a tungsten silicide film, as defined in claim 1,
    wherein, instead of said temperature raising process and said first DCS treatment process, performed is a treatment process of processing said silicon wafer using $H_2$ gas in a range of 300° C. to 850° C.

13. The method of forming a tungsten silicide film, as defined in claim 1,
    wherein, preceding to said temperature raising process, performed is a treatment process of processing said silicon wafer with either
    a processing solution of hydrogen peroxide the concentration of which is in a range of 0.1 to 35%,
    a processing solution in which solved is 03 the concentration of which is in a range of 0.5 to 30 ppm, or
    a processing solution in which hydrogen peroxide and ozone are solved.

14. The method of forming a tungsten silicide film, as defined in claim 13,.
    wherein any of said processing solutions contain HF the concentration of which is in a range of 0.001 to 0.5%.

15. The method of forming a tungsten silicide film, CR as defined in claim 1,
wherein, instead of said temperature raising process, performed is a treatment process of processing said silicon wafer using either $O_2$ gas, $O_3$ gas, or $H_2O$ vapor.

16. The method of forming a tungsten silicide film, as defined in claim 1,
wherein, instead of said temperature raising process or said first DCS treatment process, performed is a treatment process of processing said silicon wafer using either $O_2$ gas, $O_3$ gas, or $H_2O$ vapor.

17. The method of forming a tungsten silicide film, as defined in claim 1,
wherein a tungsten-high constituting layer is deposited on an interface with said silicon wafer, and a tungsten-low constituting layer is deposited on said tungsten-high constituting layer.

18. The method of forming a tungsten silicide film, as defined in claim 17,
wherein the ratio in number between tungsten atoms and silicon atoms in said tungsten silicide film is 2.4 or less in said tungsten-high constituting layer, and is 2.5 or more in said tungsten-low constituting layer.

19. A method of fabricating a semiconductor device, comprising a process in which the tungsten silicide film is formed through a forming process as defined in claim 1.

20. A semiconductor device, comprising the tungsten silicide film formed through a forming process as defined in claim 1.

* * * * *

UNITED STATES PATENT AND TRADEMARK OFFICE
CERTIFICATE OF CORRECTION

PATENT NO.    : 6,221,771 B1
DATED         : April 24, 2001
INVENTOR(S)   : Cozy Ban, et al.

Page 1 of 1

It is certified that error appears in the above-identified patent and that said Letters Patent is hereby corrected as shown below:

<u>Title page,</u>
Under item [54], line 3, change "DEVICES" to -- DEVICE --.

<u>Column 1,</u>
In the title, line 3, change "DEVICES" to -- DEVICE --.

Signed and Sealed this

Sixteenth Day of October, 2001

Attest:

*Nicholas P. Godici*

NICHOLAS P. GODICI
*Attesting Officer*  *Acting Director of the United States Patent and Trademark Office*